(12) United States Patent
Nakai

(10) Patent No.: US 7,755,952 B2
(45) Date of Patent: Jul. 13, 2010

(54) SEMICONDUCTOR MEMORY DEVICE AND WRITING CONTROL METHOD THEREOF

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 132 days.

(21) Appl. No.: 12/196,393

(22) Filed: Aug. 22, 2008

(65) Prior Publication Data

US 2009/0052233 A1 Feb. 26, 2009

(30) Foreign Application Priority Data

Aug. 24, 2007 (JP) .............................. 2007-217967

(51) Int. Cl.
*G11C 7/00* (2006.01)
(52) U.S. Cl. .......................... 365/189.16; 365/189.011; 365/230.03
(58) Field of Classification Search ............ 365/189.16, 365/189.011, 230.03
See application file for complete search history.

(56) References Cited

U.S. PATENT DOCUMENTS 7,471,590 B2 * 12/2008 Davis et al. ............ 365/230.06

FOREIGN PATENT DOCUMENTS

| JP | 2005158199 A | 6/2005 |
|---|---|---|
| JP | 200624355 A | 1/2006 |

* cited by examiner

*Primary Examiner*—Son Dinh
*Assistant Examiner*—Nam Nguyen
(74) *Attorney, Agent, or Firm*—Sughrue Mion, PLLC

(57) ABSTRACT

A semiconductor memory device includes: a plurality of write control circuits; a plurality of memory cells grouped in the write control circuits; a plurality of write drivers that write data to a corresponding memory cell when the write control circuit is activated; and a main control circuit that causes the write control circuits to become active in response to presence of a data writing request to the memory cells belonging to a predetermined group and subsequent absence of the data writing request to the memory cells belonging to the same group within a predetermined period.

11 Claims, 18 Drawing Sheets

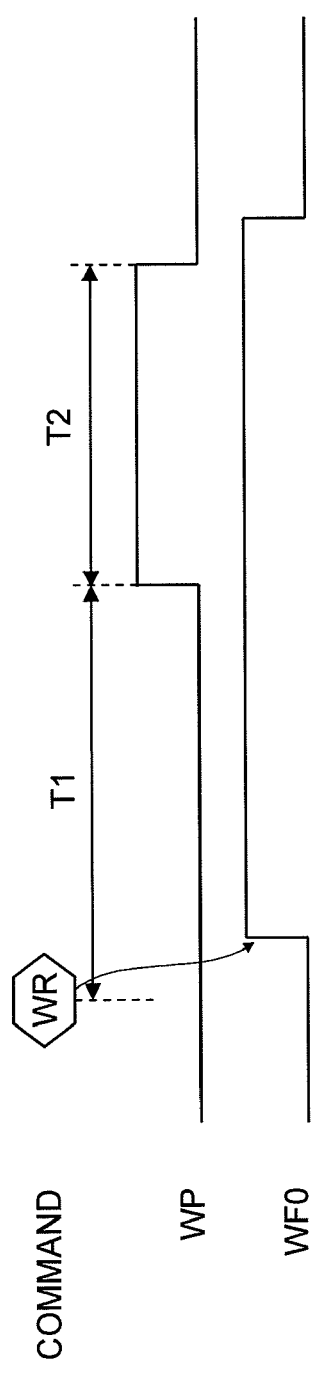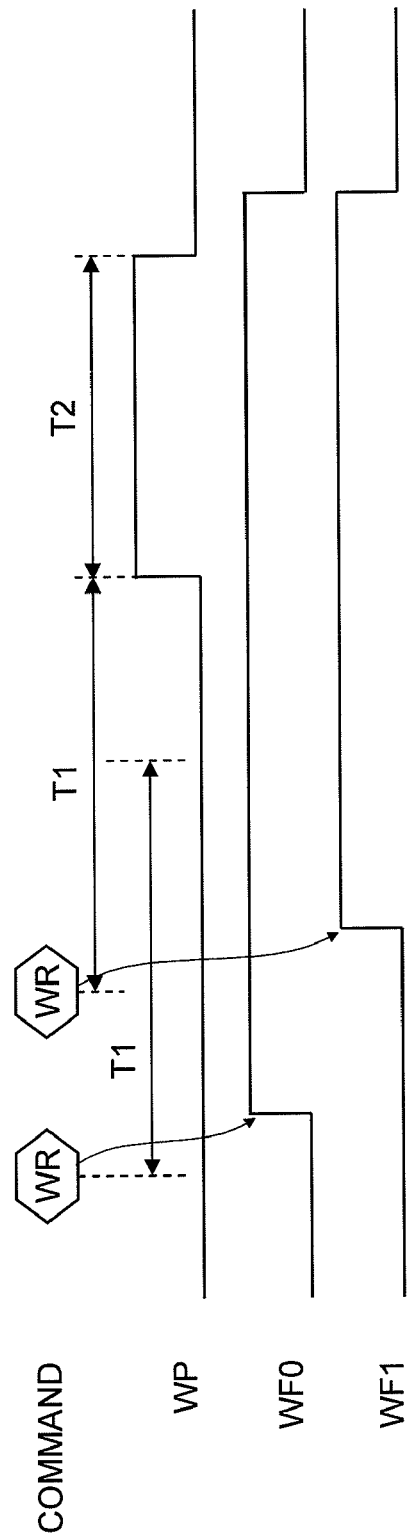

SEMICONDUCTOR MEMORY DEVICE AND WRITING CONTROL METHOD THEREOF

BACKGROUND OF THE INVENTION

1. Field of the Invention

The present invention relates to a semiconductor memory device and a writing control method thereof, and, more particularly relates to a semiconductor memory device having a memory cell of which a required time of writing data is relatively long, and a writing control method of such a semiconductor memory device.

2. Description of Related Art

In personal computers or servers, hierarchically constructed various storage devices are used. A lower-hierarchical storage device is required to be low price and has a large capacity, while a higher-hierarchical one is required to be capable of high-speed access. As a lowest-hierarchical storage device, a magnetic storage such as a hard disk drive and a magnetic tape is generally used. The magnetic storage is nonvolatile and capable of saving a considerably large amount of data at a lower price as compared to a semiconductor memory device or the like. However, the magnetic storage is slow in access speed, and does not have random accessibility in many cases. Therefore, a program or data to be saved for a long period is stored in the magnetic storage, and is optionally changed to a higher-hierarchical storage device.

A main memory is a storage device higher in hierarchy than the magnetic storage. Generally, a DRAM (Dynamic Random Access Memory) is used for the main memory. The DRAM can be accessed at higher speed as compared to the magnetic storage, and in addition, the DRAM has the random accessibility. Further, the DRAM has a characteristic that a cost-per-bit is lower in price than a high-speed semiconductor memory such as an SRAM (Static Random Access Memory).

A highest-hierarchical storage device is an internal cache memory included in an MPU (Micro Processing Unit). The internal cache memory is connected via an internal bus to a core of the MPU, and thus, it can be accessed at remarkably high speed. However, a recording capacity to be secured is considerably small. As a storage device that configures a hierarchy between the internal cache and the main memory, a secondary cache, or a tertiary cache, or the like is used occasionally.

The reason that the DRAM is selected as the main memory is that it has a very good balance between the access speed and the cost-per-bit. Further, the DRAM has a large capacity among the semiconductor memories, and recently, a chip with a capacity of 1 gigabit or more has been developed. However, the DRAM is a volatile memory, and stored data is lost when the power is turned off. Thus, the DRAM is not suitable for a program or data to be save for a long period. In the DRAM, a refresh operation needs to be periodically performed to save the data even while the power supply is turned on. Thus, there is a limit to reduction in power consumption, and there is a problem that complicated control by a controller is needed.

As a nonvolatile semiconductor memory of large capacity, a flash memory is known. However, the flash memory has disadvantages in that a large amount of electricity is needed to write and delete the data, and a writing time and a deleting time are very long. Accordingly, it is not appropriate to replace the DRAM as the main memory. Other nonvolatile memories that have been proposed include an MRAM (Magnetoresistive Random Access Memory), an FRAM (Ferroelectric Random Access memory) or the like. However, it is difficult to obtain a storage capacity equal to that of the DRAM.

On the other hand, as a semiconductor memory that replaces the DRAM, a PRAM (Phase change Random Access Memory) in which a phase change material is used to record is proposed (see Japanese Patent Application Laid Open Nos. 2006-24355 and 2005-158199, and U.S. Pat. No. 5,536,947). In the PRAM, the data is stored by a phase state of the phase change material included in a recording layer. That is, the phase change material differs greatly in electrical resistance between a crystalline phase and an amorphous phase. The data can be stored by using this characteristic.

The phase state can be changed by applying a write current to the phase change material, which heats the phase change material. Data-reading is performed by applying a read current to the phase change material and sensing the resistance value. The read current is set to a value sufficiently small as compared to the write current so that no phase change occurs. Thus, the phase state of the phase change material does not change unless a high heat is applied thereto, and accordingly, even when the power is turned off, the data is not lost.

To make the phase change material amorphous (the reset operation), it is necessary to heat the phase change material to a temperature equal to or higher than a melting point and to then rapidly quenching the phase change material. On the other hand, to crystallize the phase change material (the set operation), it is necessary to heat the phase change material to a temperature equal to or higher than a crystallization temperature and lower than the melting point by applying the write current to the phase change material, and to then gradually cool the phase change material. Due to this, the PRAM is characterized in that it takes longer time to perform the set operation than the reset operation.

Thus, in the PRAM, a time required for the set operation and that required for the reset operation differ greatly, and thus, to ensure compatibility with other general-purpose memory such as a DRAM, control using a set pulse for performing the set operation and a reset pulse for performing the reset operation is often performed.

On the other hand, in accessing the other general-purpose memory such as a DRAM, the address is generally inputted in twice. That is, a row address is firstly inputted, and subsequently, a column address is inputted. In the DRAM herein, for example, when the row address is inputted and thereafter different column addresses are continuously inputted, continuous data writing can be performed. To enable such a continuous data writing also in the PRAM, a write control circuit that generates the set pulse and the reset pulse (these are collectively called a write pulse) can be arranged for each page. The "page" indicates a memory cell group to which the same column address is allocated.

However, when the write control circuit is arranged for each page, a circuit size is inevitably increased. In particular, in a case of a semiconductor memory device of which the page length is long such as the DRAM, when the circuit size is increased, a chip area is greatly increased. In this regard, such a problem is generated commonly not only in the PRAM but also in a semiconductor memory device having a memory cell of which the data writing time is relatively long.

SUMMARY

The present invention seeks to solve one or more of the above problems, or to improve upon those problems at least in part.

In one embodiment, there is provided a semiconductor memory device that includes a plurality of write control circuits; a plurality of memory cells grouped into a plurality of groups, each group corresponding to an associated one of the write control circuits; a plurality of write drivers that store data to a corresponding memory cell when the write control circuits are brought into an active state; and a main control circuit that brings one of the write control circuits into the active state in response to presence of a data writing request to a memory cell belonging to a predetermined group and subsequent absence of the data writing request to another memory cell belonging to the same group within a predetermined period.

The main control circuit preferably withholds a data writing process corresponding to a first data writing request in response to presence of the first data writing request to a predetermined group and subsequent presence of a second data writing request to the same group within a predetermined period. In this case, the main control circuit preferably causes the write control circuits to become active in response to presence of the second data writing request and subsequent absence of the data writing request to the same group within the predetermined period thereby to execute the data writing process corresponding to the first data writing request.

In another embodiment, there is provided a writing control method of a semiconductor memory device including a plurality of write control circuits, a plurality of memory cells grouped into a plurality of groups each corresponding to an associated one of the write control circuits, and a plurality of write drivers that store data to a corresponding memory cell when the write control circuits are brought into an active state, the control method comprising: withholding a data writing process corresponding to a first data writing request in response to presence of the first data writing request to a predetermined group and subsequent presence of a second data writing request to the same group within a predetermined period; and performing the data writing process corresponding to the first data writing request in response to subsequent absence of the data writing request to the same group after the second data writing request within the predetermined period.

According to the present invention, when the data writing request is performed, the write control circuits are not immediately activated, but activated after a lapse of a predetermined period. Thus, although each write control circuit is allocated to each group into which a plurality of memory cells are grouped, a writing operation similar to a case that the write control circuits are allocated to each page is enabled.

Accordingly, it becomes possible to reduce a circuit size of a semiconductor memory device having a memory cell of which the required time of writing data is relatively long.

BRIEF DESCRIPTION OF THE DRAWINGS

The above features and advantages of the present invention will be more apparent from the following description of certain preferred embodiments taken in conjunction with the accompanying drawings, in which:

FIGS. 2A and 2B are timing charts each for explaining the operation of the semiconductor memory device shown in FIG. 1, where FIG. 2A shows a case that a continuous data writing request to the same group G is not generated within a predetermined period, and FIG. 2B shows a case that the continuous data writing request to the same group G is generated within a predetermined period;

DETAILED DESCRIPTION OF THE PREFERRED EMBODIMENTS

Before giving detailed descriptions of embodiments of the present invention, an overview of the invention is described.

Figure 1:
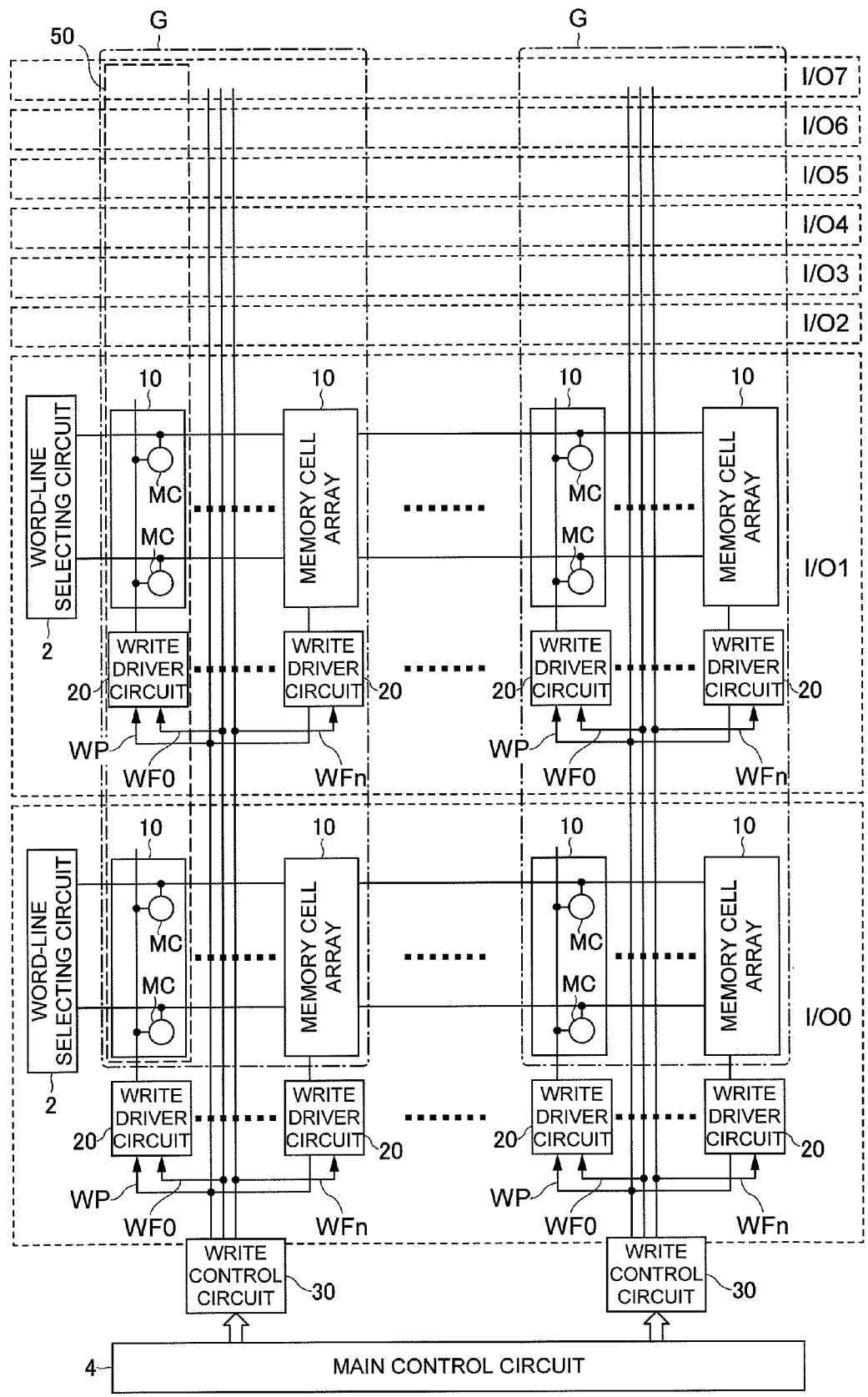
FIG. 1 is a circuit diagram for explaining an overview of a semiconductor memory device according to the present invention.

FIG. 1 is a circuit diagram for explaining an overview of a semiconductor memory device according to the present invention.

A semiconductor memory device shown in FIG. 1 includes: a plurality of memory cell arrays 10; write driver circuits 20 each arranged for every memory cell array 10; and write control circuits 30 each allocated to the write driver circuits 20. Each memory cell array 10 is a memory cell group to which the same column address is allocated. The write driver circuit 20 is placed to the selected memory cell array 10 on a one-to-one basis, and write flags WF0 to WFn are shared by the write driver circuits 20 to which the same column address is allocated. A write pulse WP is shared by a predetermined number of write driver circuits 20. Selection of a memory cell MC within the memory cell array 10 is performed by control of a word-line selecting circuit 2 based on a row address.

The memory cell arrays 10 to which the same write control circuit 30 is allocated configure one group G. Reference numeral 50 in FIG. 1 indicates one page. Accordingly, one write control circuit 30 is allocated to a plurality of pages.

The write control circuit 30 supplies commonly the write pulse WP to the corresponding write driver circuits 20 while supplying the individual write flags WF0 to WFn to the write driver circuits 20, respectively. The write pulse WP has a predetermined waveform required for writing data to the memory cell MC, and can be configured by a plurality of signals each having a waveform different depending on a logical value to be written. When the data writing to the memory cell MC is performed by a write current, the write pulse WP becomes a signal for determining an amount and an applying time of the write current. Alternatively, the write pulse WP can be a signal for determining the applying time only, and current control can be performed on a side of the write driver circuit 20.

The write flags WF0 to WFn are signals for causing the corresponding write driver circuit 20 to become active. The number of write flags WF0 to WFn to reach an active level is not limited to one, and a plurality of write flags WF0 to WFn can simultaneously be rendered an active level.

An operation of the write control circuit 30 is controlled by a main control circuit 4. When the data writing is requested, the main control circuit 4 does not immediately generate the write pulse WP in the corresponding write control circuit 30 but controls to generate the write pulse WP after a predetermined period is elapsed. More specifically, it is confirmed that the data writing to a predetermined group G is requested and no data writing is thereafter requested to the same group G within a predetermined period. Subsequently, the write control circuit 30 is caused to generate the write pulse WP.

When the data writing to the predetermined group G is requested and the data writing is thereafter requested to the same group G within the predetermined period, the main control circuit 4 withholds a data writing process. The withheld data writing process is executed after confirming absence of the data writing request to the group G within the predetermined period.

FIGS. 2A and 2B are timing charts each for explaining the operation of the semiconductor memory device shown in FIG. 1, where FIG. 2A shows a case that a continuous data writing request to the same group G is not generated within a predetermined period, and FIG. 2B shows a case that the continuous data writing request to the same group G is generated within a predetermined period.

As shown in FIG. 2A, when the continuous data writing request to the same group G is not generated, a writing request (issuance of a write command) is performed, and thereafter, the writing process is withheld until a predetermined period T1 is elapsed. After the predetermined period T1 is elapsed, the write pulse WP becomes active. The corresponding write flag (in this example, the write flag WF0) becomes active immediately in response to the write command. Thereby, after the write command is issued, the data writing is executed at a point that the period T1 is elapsed.

The data writing to the memory cell MC requires a predetermined period T2. That is, once the write pulse WP is activated, new data writing to the same group G cannot be started until the predetermined period T2 is elapsed. In view of this, in the present invention, the write pulse WP is activated after waiting for the lapse of the predetermine period T1 since the issuance of the write command. Thus, when T1≧T2 is set, the start of the new data writing to the same group G is not requested during a time that the write pulse WP is being activated.

On the other hand, as shown in FIG. 2B, when the continuous data writing request to the same group G is generated, the writing process is withheld from a last writing request until the lapse of the predetermined period T1. In an example shown in FIG. 2B, a second write command is issued before the lapse of the predetermined period T1 from the issuance of a first write command, and thus, activating the write pulse WP corresponding to the first write command is withheld. The write pulse WP becomes active after the lapse of the predetermined period T1 from the issuance of the second write command. At this time, the write flags (in this example, the write flags WF0 and WF1) each corresponding to the writing requests made twice become active, and thus, the two write driver circuits 20 become simultaneously active, and the data writing to the two memory cell arrays 10 is simultaneously executed.

The reason for performing such a process is that while the required time T2 for writing for the memory cell MC is relatively long, one write control circuit 30 is shared among the write driver circuits 20. That is, when the writing process is immediately performed in response to the issuance of the write command, the writing request to the same group G cannot be accepted during a time that the required time T2 for writing is elapsed.

In the present invention, to avoid such a problem, the write pulse WP is not activated immediately after the issuance of the write command. The write pulse WP is activated after confirming absence of the writing request to the same group G over the predetermined period T1. Thus, in spite of sharing one write control circuit 30 among the write driver circuits 20, the continuous data writing request to the same group G can be accepted.

Examples of a semiconductor memory device having a relatively long required time T2 for writing for the memory cell MC include a PRAM. A memory cell of the PRAM includes a non-volatile memory device using a phase change material, and utilizes a difference between an electrical resistance in a crystal phase of the phase change material and that in an amorphous phase thereof to perform non-volatile storage.

Figure 3:
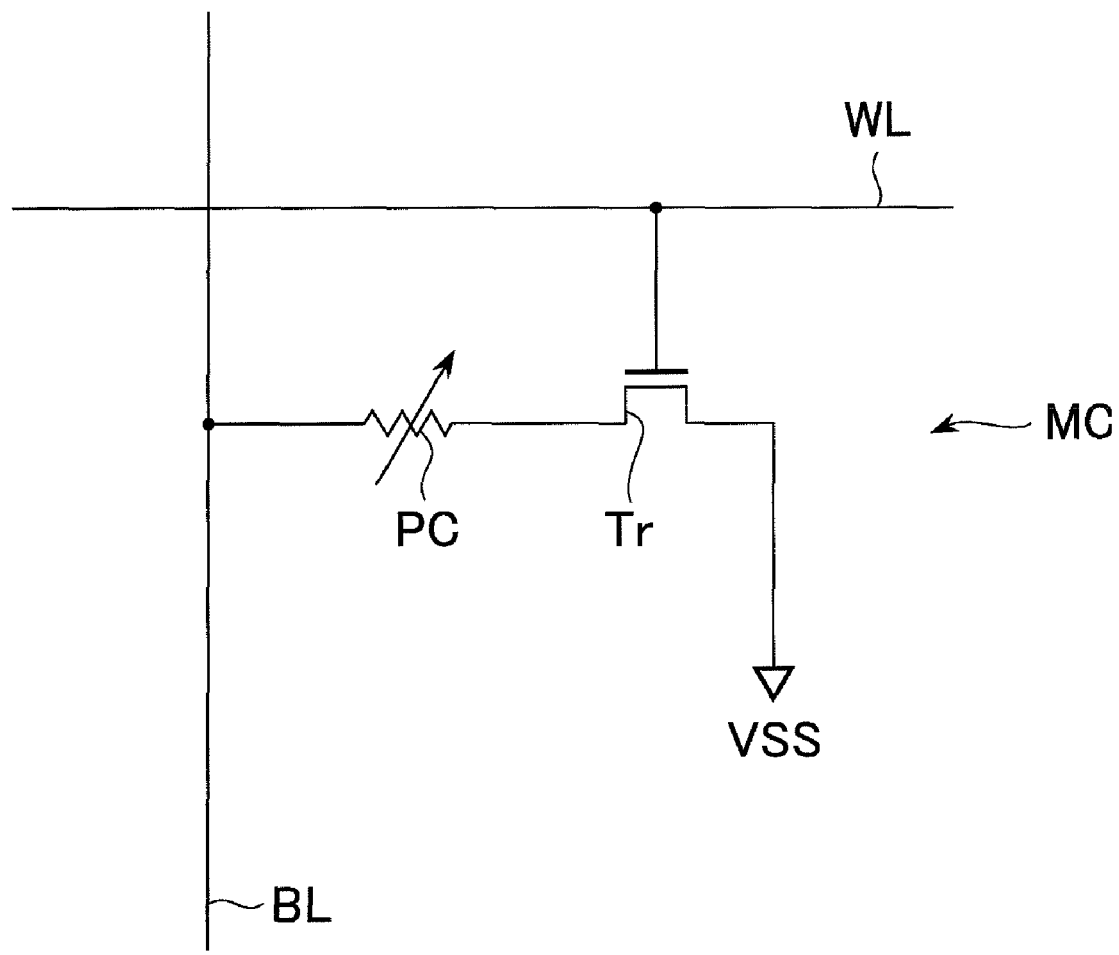
FIG. 3 is a circuit diagram of each of the memory cells MCs if the semiconductor memory device according to the present invention is a PRAM.

FIG. 3 is a circuit diagram of each of the memory cells MCs if the semiconductor memory device according to the present invention is a PRAM.

As shown in FIG. 3, if the semiconductor memory device according to the present invention is the PRAM, then each memory cell MC is configured to include a nonvolatile memory element PC made of the phase change material and a selection transistor Tr, and the memory element PC and the selection transistor Tr are connected in series between one bit line BL and one source potential VSS.

The phase change material constituting the nonvolatile memory element PC is not limited to a specific one as long as the material has two or more phase states and has different electric resistances according to the respective phase states. It is preferable to select a so-called chalcogenide material. Examples of the chalcogenide material include alloys each containing at least one element such as germanium (Ge), antimony (Sb), tellurium (Te), indium (In), and selenium (Se) More specifically, examples of the alloys include two-element alloys such as GaSb, InSb, InSe, $Sb_2Te_3$, and GeTe, three-element alloys such as $Ge_2Sb_2Te_5$, InSbTe, GaSeTe, $SnSb_2Te_4$, and InSbGe, and four-element alloys such as AgInSbTe, (GeSn) SbTe, GeSb (SeTe), and $Te_{81}Ge_{15}Sb_2S_2$.

The phase change material containing the chalcogenide material can be turned into a state of either the amorphous phase or the crystal phase. The phase change material in the amorphous phase is in a relatively high resistance state and that in the crystal phase is in a relatively low resistance state.

The selection transistor Tr is configured by an N channel MOS transistor and a gate electrode of the selection transistor Tr is connected to the corresponding word line WL. By so configuring, when the word line WL is activated, the nonvolatile memory element PC is connected between one bit line BL and the source potential VSS.

Figure 4:
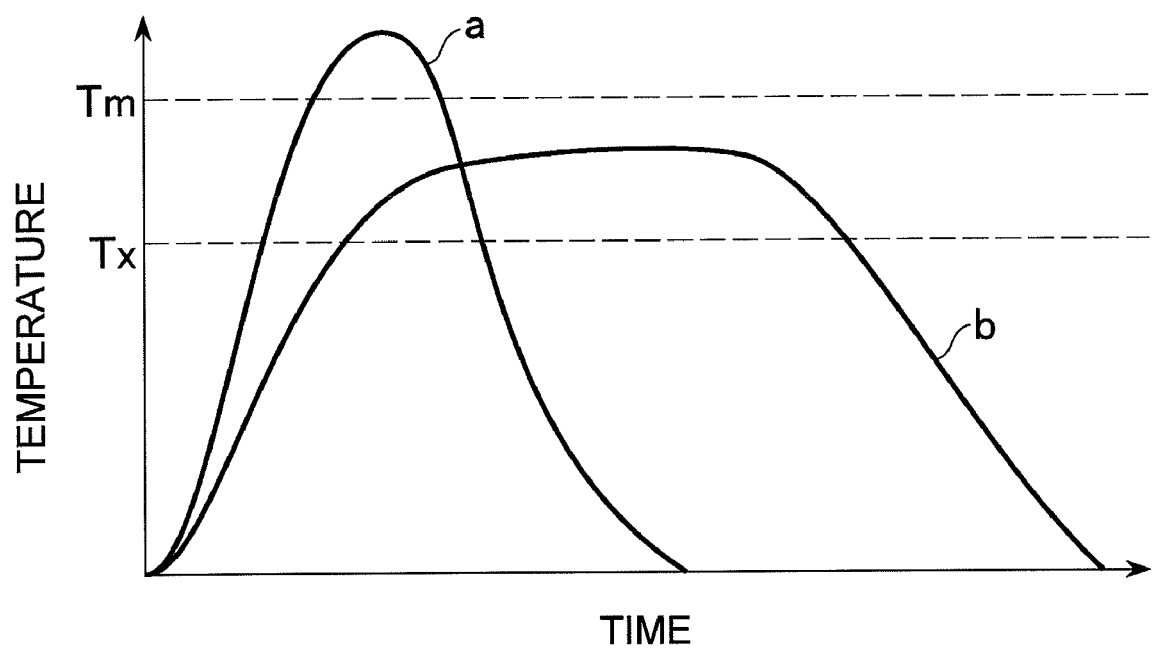
FIG. 4 is a graph for explaining phase state of phase change material containing chalcogenide material.

As described above, to amorphize (reset) the phase change material, there is a need of heating the phase change material to temperatures equal to or higher than a melting point Tm by applying the write current and subsequently cooling the resultant material rapidly. On the other hand, to crystallize (set) the phase change material, there is a need of heating the phase change material to temperatures equal to or higher than a crystallization temperature Tx and below the melting point Tm by applying the write current, and maintaining the resultant material in this state for a predetermined period. FIG. 4 is a graph for explaining this. A curve "a" shows a heating method when the phase change material configuring the non-volatile memory device PC is amorphized (reset) and a curve "b" shows a heating method when the phase change material configuring the non-volatile memory device PC is crystallized (set).

As shown in FIG. 4, in the PRAM, a time (T2 shown in FIG. 2) required for the set operation is longer than the reset operation. Accordingly, for example, when an operation synchronous with a clock is performed, if a clock cycle is less than T2, completion of the writing process becomes unable for each cycle. However, in the present invention, as shown in FIG. 2, which is a timing chart, even when the write command is issued, the write pulse WP is not activated immediately. The write pulse WP is activated after confirming absence of the writing request to the same group G over the predetermined period T1. Thus, even when the continuous data writing request to the same group G is generated, similar to a synchronous DRAM, a continuous write operation synchronous with a clock signal CLK can be performed.

A more specific embodiment of the present invention is described next.

Figure 5:
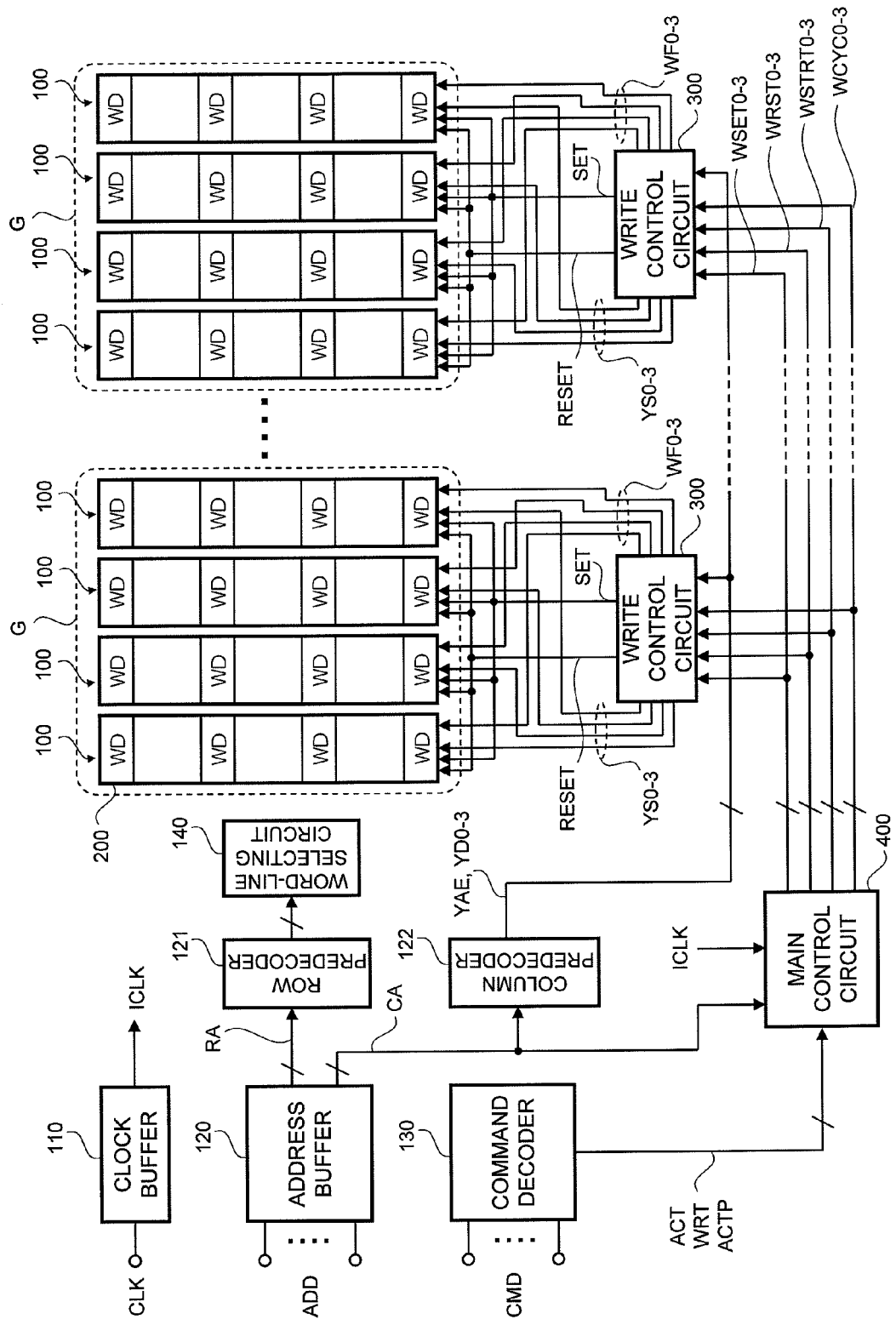
FIG. 5 is a circuit diagram of the semiconductor memory device according to a preferred embodiment of the present invention.

FIG. 5 is a circuit diagram of the semiconductor memory device according to a preferred embodiment of the present invention.

As shown in FIG. 5, the semiconductor memory device includes: a plurality of grouped memory cell arrays 100; write driver circuits 200 (in FIG. 5, denoted as "WD") arranged in plural for one memory cell array 100; a write control circuit 300 arranged for each group G; and a main control circuit 400 that controls an operation of each write control circuit 300.

Similar to the semiconductor memory device shown in FIG. 1, each memory cell array 100 is a group of memory cells to which the same column address is allocated. Each memory cell array 100 is configured by one page of memory cells. In the present embodiment, 4 pages of memory cell arrays 100 configure one group G. In each memory cell array 100, the non-volatile memory devices PC shown in FIG. 3 are arrayed in a matrix.

The semiconductor memory device includes: a clock buffer 110 supplied with an external clock CLK; an address buffer 120 supplied with an address signal ADD; and a command decoder 130 supplied with a command CMD. An internal clock ICLK passing through the clock buffer 110 is supplied to each component, and used as a timing signal. The command decoder 130 generates various kinds of internal commands (an active command ACT, a write command WRT, a read command RD, etc.,) according to a combination of commands CMD. Out of the generated internal commands, at least the active command ACT, the write command WRT, and a reset command ACTP are supplied to the main control circuit 400.

The address buffer 120 is supplied with the address signal ADD in order of a row address and a column address. A row address RA buffered by the address buffer 120 is supplied to a row predecoder 121, and a column address CA buffered by the address buffer 120 is supplied to a column predecoder 122 and the main control circuit 400.

The row address RA predecoded by the row predecoder 121 is supplied to a word-line selecting circuit 140. Based thereon, the word-line selecting circuit 140 causes any word line (not shown in FIG. 5) laid down in the memory cell arrays 100 to become active. On the other hand, the column address CA predecoded by the column predecoder 122 is supplied to the write control circuits 300.

Figure 6:
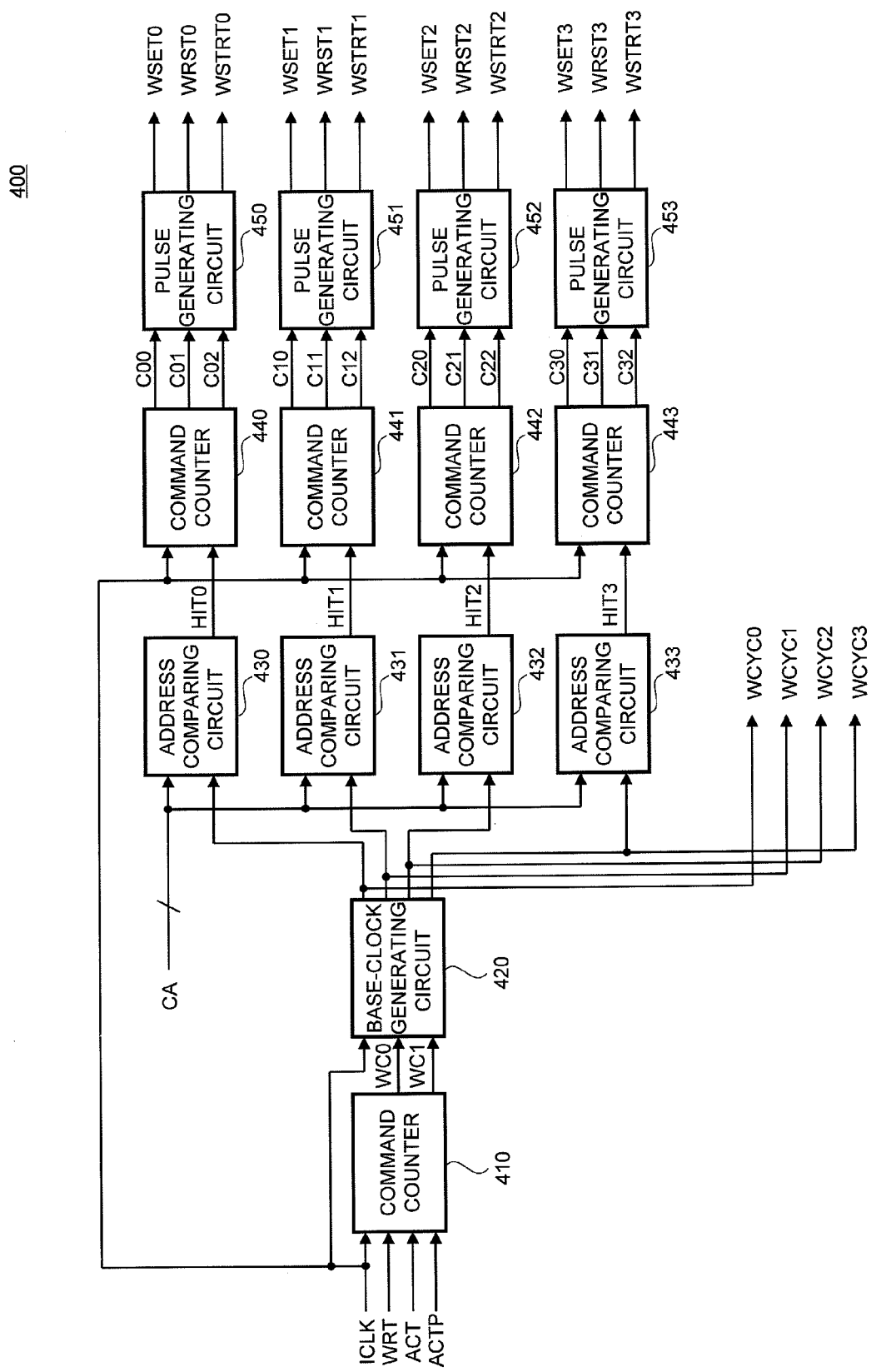
FIG. 6 is a block diagram showing a configuration of the main control circuit 400.

FIG. 6 is a block diagram showing a configuration of the main control circuit 400.

As shown in FIG. 6, the main control circuit 400 is configured by: a command counter 410; a base-clock generating circuit 420; and address comparing circuits 430 to 433; command counters 440 to 443; and pulse generating circuits 450 to 453. Hereinafter, each circuit configuring the main control circuit 400 is described in detail.

Figure 7:
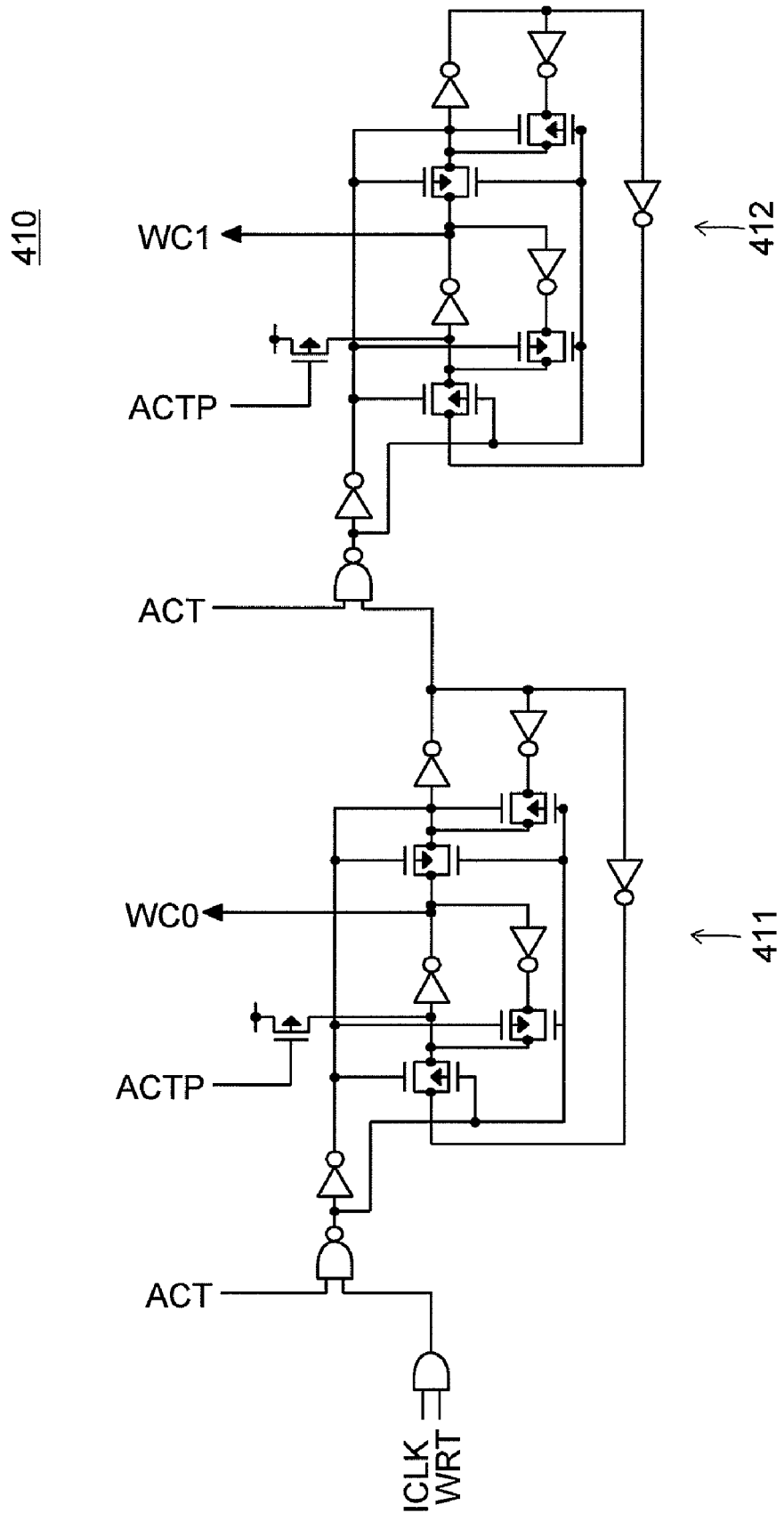
FIG. 7 is a circuit diagram of the command counter 410 included in the main control circuit 400.

FIG. 7 is a circuit diagram of the command counter 410 included in the main control circuit 400.

The command counter 410 is a circuit that receives the internal clock ICLK, the active command ACT, the write command WRT, and the reset command ACTP to generate 2-bit count signals WC0 and WC1.

As shown in FIG. 7, the command counter 410 includes first and second latch circuit units 411 and 412, which are connected in cascade. When the active command ACT and the write command WRT become active (reach a high level), the first latch circuit unit 411 synchronizes with the internal clock ICLK and inverts the count signal WC0 which is output of the command counter 410. In an initial state, because of being active of the reset command ACTP, the count signal WC0 is at low level.

Similarly, when the active command ACT and the count signal WC0 become active (reach a high level), the second latch circuit unit 412 synchronizes with the internal clock ICLK and inverts the count signal WC1 which is output of the command counter 410. In an initial state, because of being active of the reset command ACTP, the count signal WC1 also is at low level.

With this configuration, the command counter 410 continues a count-up at each time the write command WRT becomes active, and causes the count values (WC1 and WC0) to change as "00", "01", "10", and "11". The count signals WC0 and WC1 are supplied to the base-clock generating circuit 420.

Figure 8:
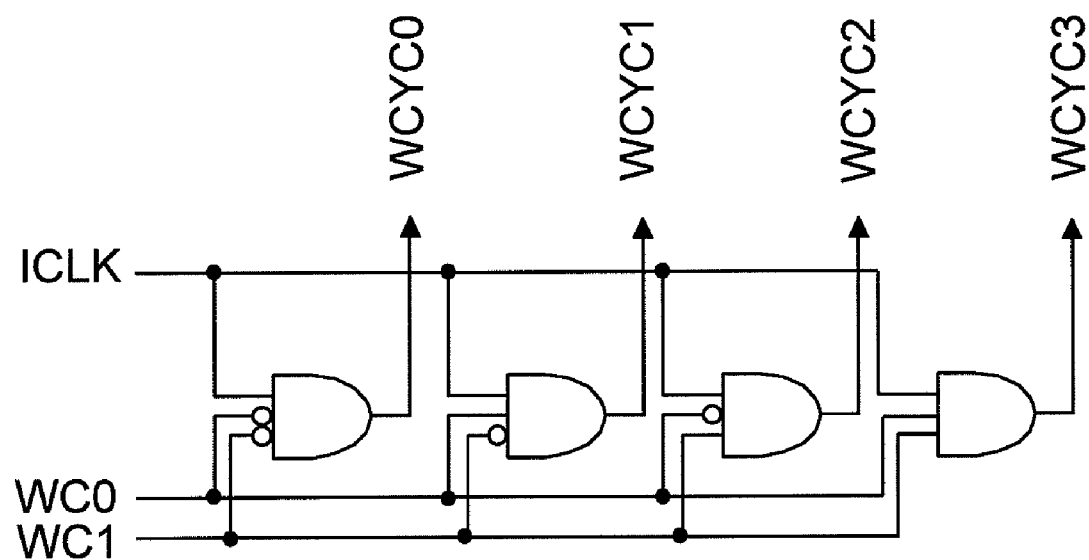
FIG. 8 is a circuit diagram of the base-clock generating circuit 420.

FIG. 8 is a circuit diagram of the base-clock generating circuit 420.

As shown in FIG. 8, the base-clock generating circuit 420 synchronizes with the internal clock ICLK to decode the count signals WC0 and WC1. More specifically, in response to the count values, i.e., "00", "01", "10", and "11", write cycle signals WCYC0, WCYC1, WCYC2, and WCYC3 become active, respectively. The generated write cycle signals WCYC0 to WCYC3 are supplied to the respectively corresponding address comparing circuits 430 to 433, and are commonly supplied to the write control circuits 300 shown in FIG. 5.

Figure 9:
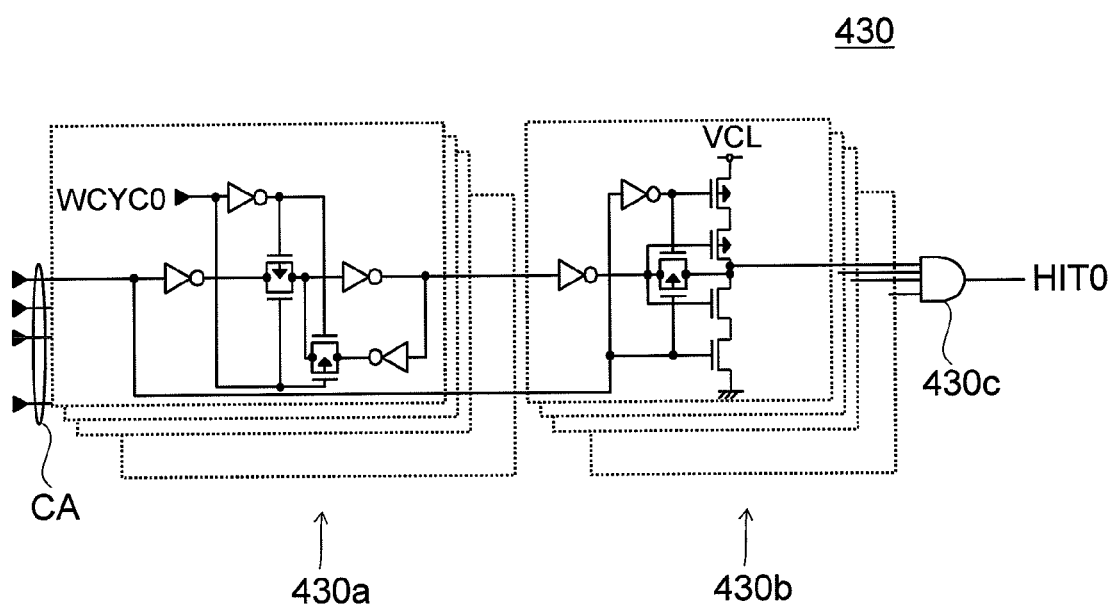
FIG. 9 is a circuit diagram of the address comparing circuit 430.

FIG. 9 is a circuit diagram of the address comparing circuit 430.

As shown in FIG. 9, the address comparing circuit 430 is configured by bit latch circuits 430a and bit comparing circuits 430b of which the numbers are equal to the number of bits of the column address CA. When the write cycle signal WCYC0 becomes active (reaches a high level), the bit latch circuits 430a latch a corresponding bit of the column address CA. The bit comparing circuits 430b compare the corresponding bit of the column address CA and a bit latched to the bit latch circuit 430a, and when logical values of these bits match each other, the output is set to be a high level.

Outputs of the bit comparing circuits 430b are inputted to an AND gate 430c. Thus, when the column address CA latched to the bit latch circuits 430a matches the current column address CA, a hit signal HIT0 becomes active at a high level.

The other address comparing circuits 431 to 433 have the same circuit configuration as that of the address comparing circuit 430 shown in FIG. 9 except that instead of the write cycle signal WCYC0, the write cycle signals WCYC1 to WCYC3 are used, respectively. Thereby, the address comparing circuits 431 to 433 generate hit signals HIT1 to HIT3, respectively. The hit signals HIT0 to HIT3 thus generated are supplied to the command counters 440 to 443, respectively.

Figure 10:
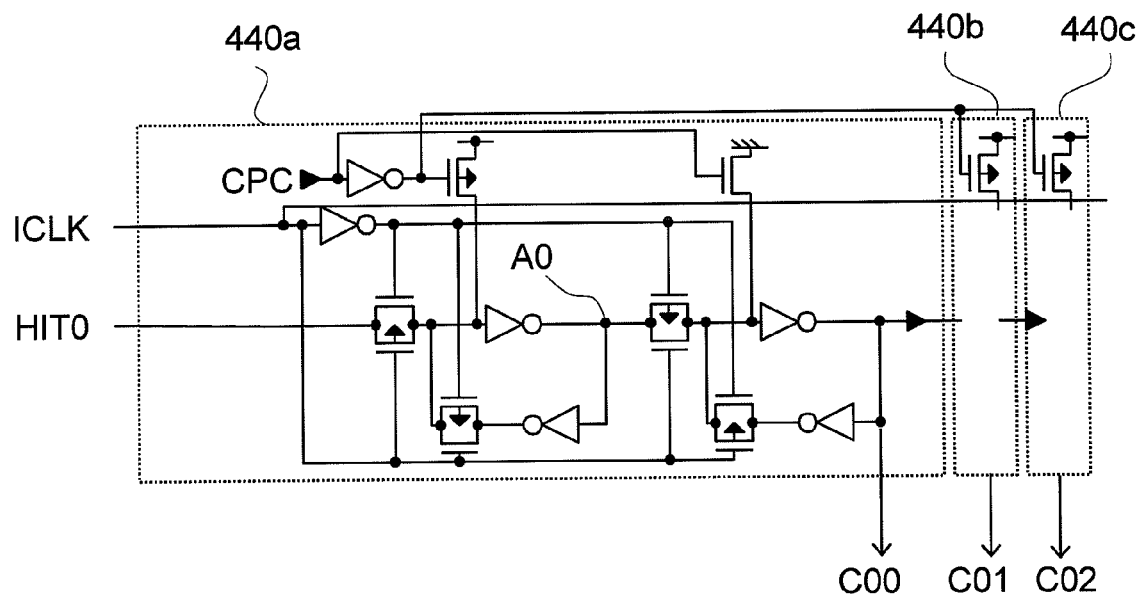
FIG. 10 is a circuit diagram of the command counter 440.

FIG. 10 is a circuit diagram of the command counter 440.

As shown in FIG. 10, the command counter 440 is a circuit that receives the internal clock ICLK and the hit signal HIT0 to generate 3-bit count signals C00 to C02.

As shown in FIG. 10, the command counter 440 has first to third shift registers 440a to 440c, which are connected in cascade. The first shift register 440a is a circuit that latches the hit signal HIT0 in synchronism with the internal clock ICLK, and the latched signal is shifted to the second and third shift registers 440b and 440c in synchronism with the internal clock ICLK. With this configuration, three clocks of a generation history of the hit signal HIT0 can be held. In an initial state, because of being active of the reset command CPC, the count signals C00 to C02 are all reset to a low level.

The other command counters 441 to 443 have the same circuit configuration as that of the command counter 440 shown in FIG. 10 except that instead of the hit signal HIT0, the hit signals HIT1 to HIT3 are used, respectively, to generate the count signals C10 to C12, C20 to C22, and C30 to C32. Thereby, the command counters 441 to 443 hold the three clocks of generation histories of the hit signals HIT1 to HIT3, respectively. The count signals C00 to C02, C10 to C12, C20 to C22, and C30 to C32 thus generated are supplied to the pulse generating circuits 450 to 453, respectively.

Figure 11:
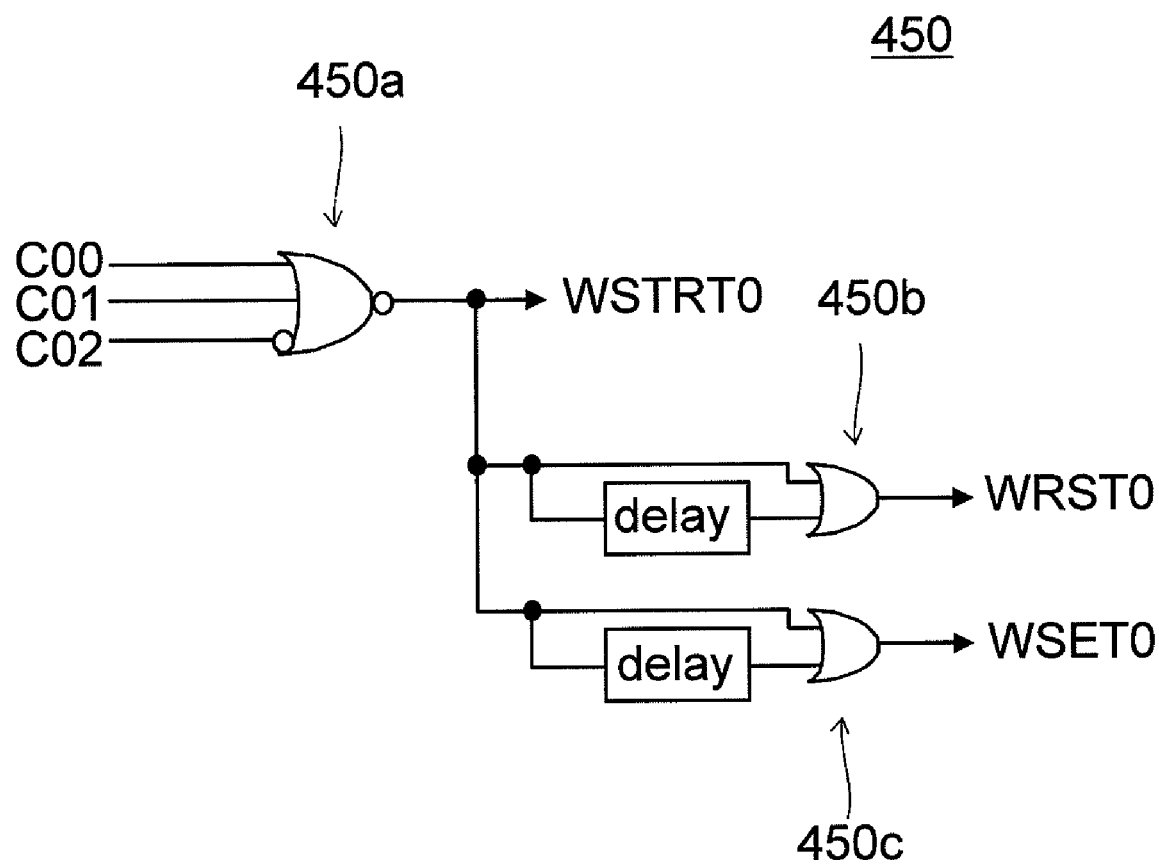
FIG. 11 is a circuit diagram of the pulse generating circuit 450.

FIG. 11 is a circuit diagram of the pulse generating circuit 450.

As shown in FIG. 11, the pulse generating circuit 450 includes: a start-pulse generating unit 450a that receives the count signals C00 to C02 to cause a start pulse WSTRT0 to become active; a reset-pulse generating unit 450b that causes a reset pulse WRST0 to become active during a first period in response to the start pulse WSTRT0 becoming active; and a set-pulse generating unit 450c that causes a set pulse WSET0 to become active during a second period in response to the start pulse WSTRT0 becoming active.

The start-pulse generating unit 450a is configured by a NOR gate, and causes only one clock of the start pulse WSTRT0 to become active when a condition under which the count signals C00 and C01 become a low level and the count signal C02 becomes a high level is satisfied. That is, when a condition under which a count value C210 (=C02, C01, and C00) becomes "100" is satisfied, the start-pulse generating unit 450a causes the start pulse WSTRT0 to become active.

The reset-pulse generating unit 450b is a circuit that causes the reset pulse WRST0 to become active only during a current applying period (=the first period) required for changing the non-volatile memory device PC shown in FIG. 3 to an amorphous state. In the present embodiment, the first period is set to one clock. On the other hand, the set-pulse generating unit 450c is a circuit that causes the set pulse WSET0 to become active only during a current applying period (=the second period) required for changing the non-volatile memory device PC shown in FIG. 3 to a crystal state. In the present embodiment, the second period is set to three clocks.

The reason why the second period (three clocks) is longer than the first period (one clock) is that as described above, to change the non-volatile memory device PC to a crystal state, there is a need of heating the phase change material to equal to or higher than the crystallization temperature Tx and less than the temperature of the fusion point Tm and maintaining the resultant material in this state for a predetermined period.

The other pulse generating circuits 451 to 453 have the same circuit configuration as that of the pulse generating circuit 450 shown in FIG. 11 except that instead of the count signals C00 to C02, the count signals C10 to C12, C20 to C22, and C30 to C32 are used, respectively, to generate respectively corresponding start pulses WSTRT1 to WSTRT3, reset pulses WRST1 to WRST3, and set pulses WSET1 to WSET3. Thus generated start pulses WSTRT0 to WSTRT3, reset pulses WRST0 to WRST3, and set pulses WSET0 to WSET3 are commonly supplied to the write control circuits 300, as shown in FIG. 5.

Thus, the specific circuit configuration of the main control circuit 400 is described. A circuit configuration of the write control circuit 300 is described next.

Figure 12:
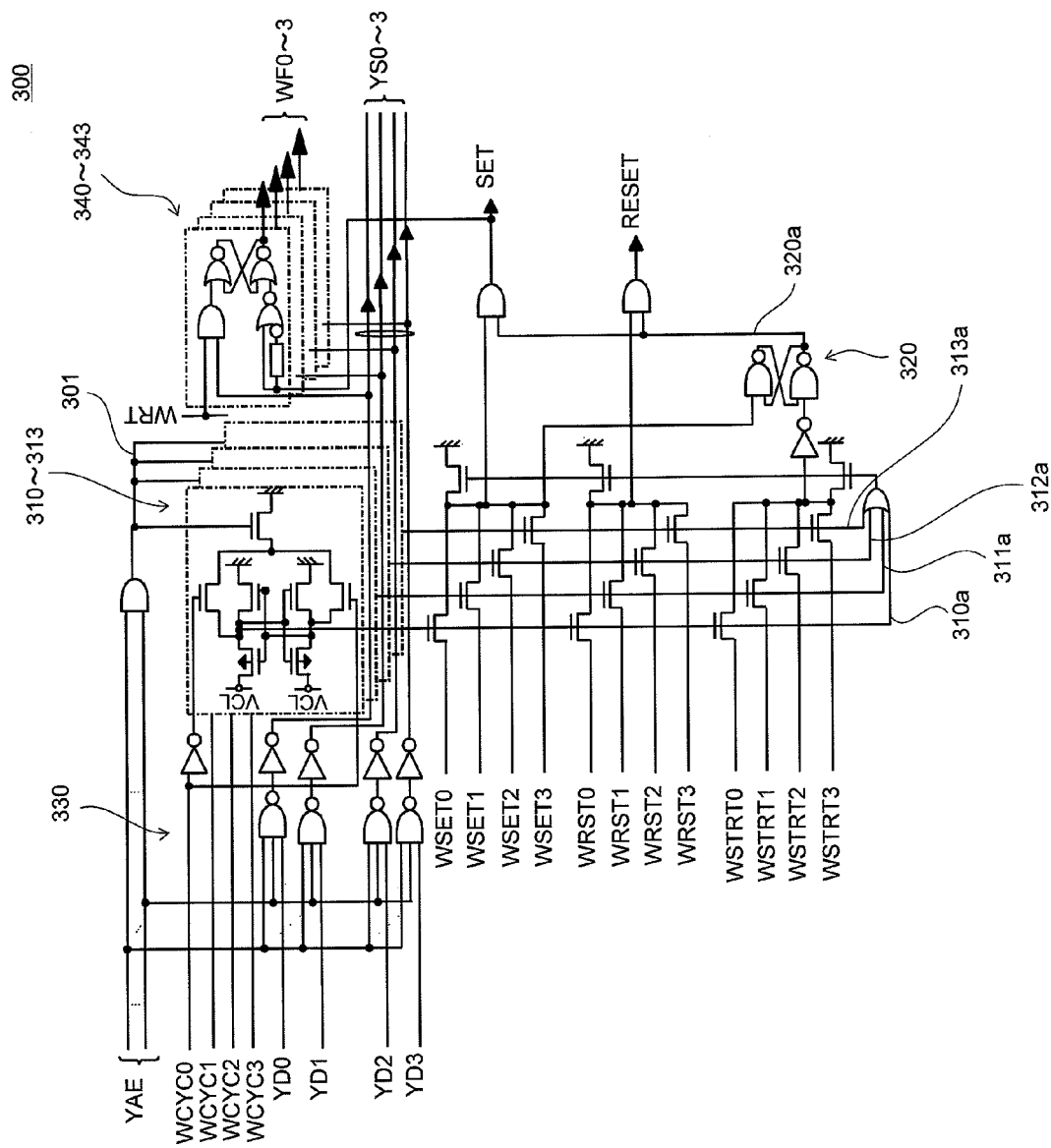
FIG. 12 is a circuit diagram of the write control circuit 300.

FIG. 12 is a circuit diagram of the write control circuit 300.

As shown in FIG. 12, the write control circuit 300 includes four latch circuits 310 to 313. The four latch circuits 310 to 313 are commonly supplied with a selection signal 301. The selection signal 301 is a decode result of a predecode signal YAE generated as a result of a high-order bit of the column address being predecoded. Thus, the selection signal 301 that is activated differs depending on each write control circuit 300. Accordingly, it is any one of the write control circuits 300 that is activated based on a predetermined column address CA.

The four latch circuits 310 to 313 are supplied with write cycle signals WCYC0 to WCYC3, respectively. In the write cycle signals WCYC0 to WCYC3, any one of these signals becomes a high level, and thus, when the write control circuit 300 is activated based on the predetermined column address CA, any one of outputs 310a to 313a of the latch circuits 310 to 313 becomes a high level.

The outputs 310a to 313a are signals for permitting reception of the corresponding start pulses WSTRT0 to WSTRT3, reset pulses WRST0 to WRST3, and set pulses WSET0 to WSET3. For example, the start pulse WSTRT0, the reset pulse WRST0, and the set pulse WSET0 become effective only in the write control circuit 300 of which the output 310a is at a high level.

When any one of the start pulses WSTRT0 to WSTRT3 is received (that is, any one of the start pulses WSTRT0 to WSTRT3 becomes a high level and the corresponding outputs 310a to 313a become a high level), a flip-flop 320 is set and output 320a of the flip-flop 320 becomes a high level. Thereby, the set pulse SET having the same waveform as those of the received set pulses WSET0 to WSET3 is generated, and the reset pulse RESET having the same waveform as those of the received reset pulses WRST0 to WRST3 is generated. The flip-flop 320 is reset when the received set pulses WSET0 to WSET3 return to a low level.

In the write control circuit 300, a decoder 330 that decodes the predecode signals YAE and YD0 to YD3 is arranged. The predecode signals YD0 to YD3 are signals obtained by decoding lower 2 bits of the column address CA, and accordingly, any one of the predecode signals YD0 to YD3 becomes active. Thus, based on the predecode signal YAE, the predetermined write control circuit 300 is activated, any one of column switch signals YS0 to YS3 is to become active based on the predecode signals YD0 to YD3.

The column switch signals YS0 to YS3 are supplied to flag generating circuits 340 to 343, respectively. The flag generating circuits 340 to 343 are set when the write command WRT and the corresponding column switch signals YS0 to YS3 become active, and cause the corresponding write flags WF0 to WF3 to become active. Active states of the write flags WF0 to WF3 that are activated are maintained until the set pulse SET becomes inactivated. Plural pieces of write flags WF0 to WF3 can be activated. When the set pulse SET becomes inactivated, all the write flags WF0 to WF3 are inactivated.

The specific circuit configuration of the write control circuit 300 is as described above. The set pulse SET, the reset pulse RESET, the column switch signals YS0 to YS3, and the write flags WF0 to WF3 generated by the write control circuit 300 are supplied to the write driver circuit 200 shown in FIG. 5. A circuit configuration of the write driver circuit 200 is described next.

Figure 13:
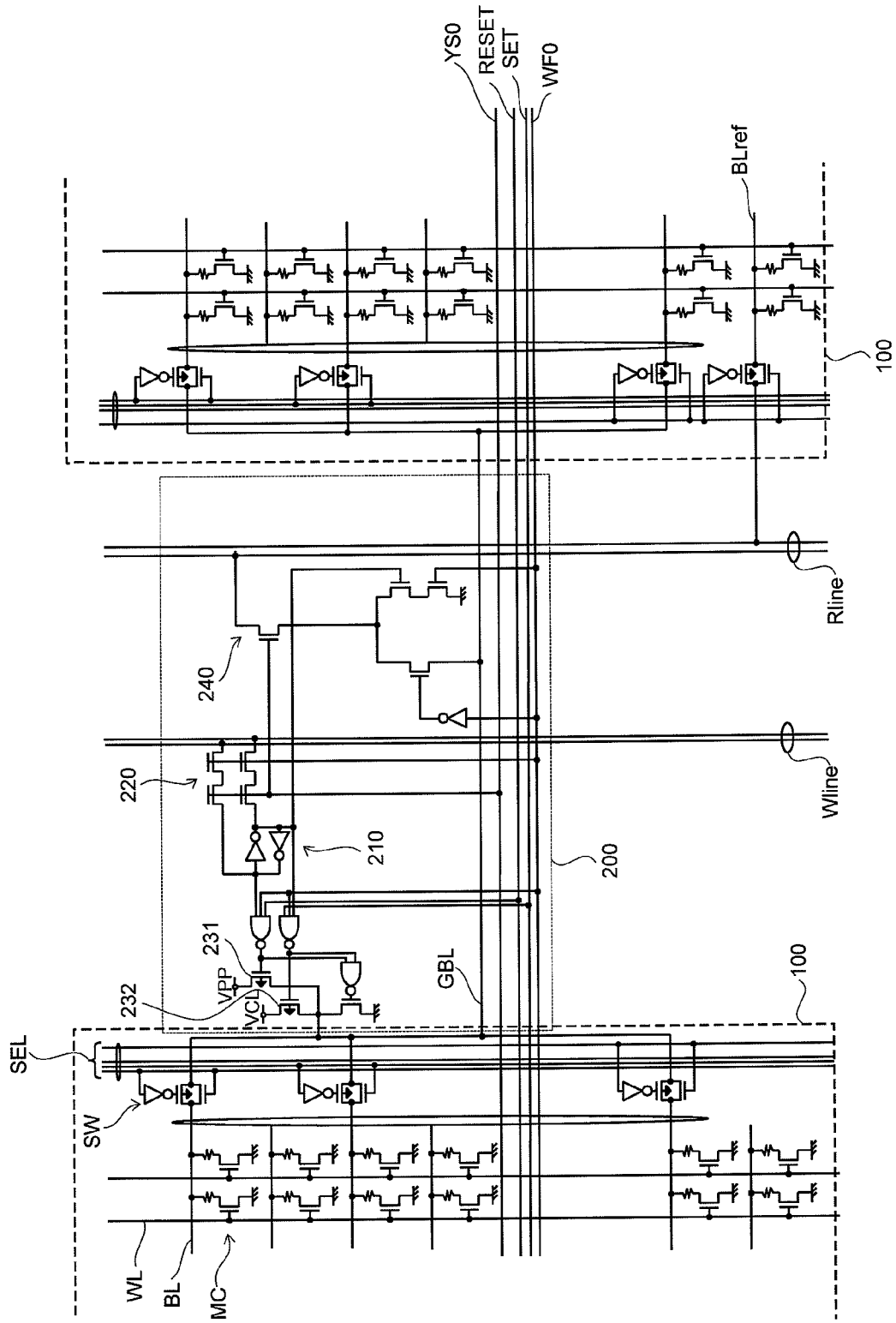
FIG. 13 is a circuit diagram of the write driver circuit 200 and its periphery.

FIG. 13 is a circuit diagram of the write driver circuit 200 and its periphery.

The write driver circuit 200 shown in FIG. 13 is the write driver circuit 200 corresponding to the column switch signal YS0 and the write flag WF0. As shown in FIG. 13, the write driver circuit 200 includes a write data latch 210 that temporarily holds data to be written. The write data latch 210 is connected to complementary write lines Wline via a switch 220. The switch 220 becomes conductive when both the corresponding column switch signal YS0 and write flag WF0 become active at a high level.

When the write data held in the write data latch 210 is "0", a resetting transistor 231 becomes conductive in synchronism with the reset pulse RESET. On the other hand, when the write data held in the write data latch 210 is "1", a setting transistor 232 becomes conductive in synchronism with the set pulse SET. A source of the resetting transistor 231 is connected to a reset potential wiring VPP, and that of the setting transistor 232 is connected to a set potential wiring VCL. Thus, when the reset pulse RESET becomes active, a global bit line GBL is supplied with a reset potential VPP, and when the set pulse SET becomes active, the global bit line GBL is supplied with a set potential VCL.

The global bit line GBL is connected to a plurality of bit lines BL (for example, 16 bit-lines) via bit line switches SW. The bit line switches SW are supplied with a selection signal SEL generated based on the row address RA, and only any one of the bit line switches SW is turned on. The global bit line GBL is thereby connected only to any one of the bit lines BL.

Thus, when the global bit line GBL is supplied with the reset potential VPP, a reset current is applied to a predetermined memory cell MC via the selected bit line BL. As a result, in a phase change material included in the memory cell MC, a temperature change indicated by the curve "a" in FIG. 4 is generated, and thus, the phase change material is amorphized. On the other hand, when the set potential VCL is supplied to the global bit line GBL, a set current is applied to a predetermined memory cell MC via the selected bit line BL. As a result, in the phase change material included in the memory cell MC, a temperature change indicated by the curve "b" in FIG. 4 is generated, and as thus, the phase change material is crystallized. Thereby, data writing to a desired memory cell is performed.

When data reading is performed, any one of the bit line switches SW is turned on to connect the predetermined bit line BL to the global bit line GBL. In this state, when a bias circuit not shown is used to apply a read current to read lines Rline, depending on a logical level held in the selected memory cell MC (whether the phase change material is in an amorphous state or in a crystal state), a potential of one read line Rline is determined. By comparing this potential with a potential of the other read line Rline linked to a dummy bit line BLref, the data is read.

The structure of the semiconductor memory device according to the embodiment of the present invention is as described above. An operation of the semiconductor memory device is described next.

Figure 14:
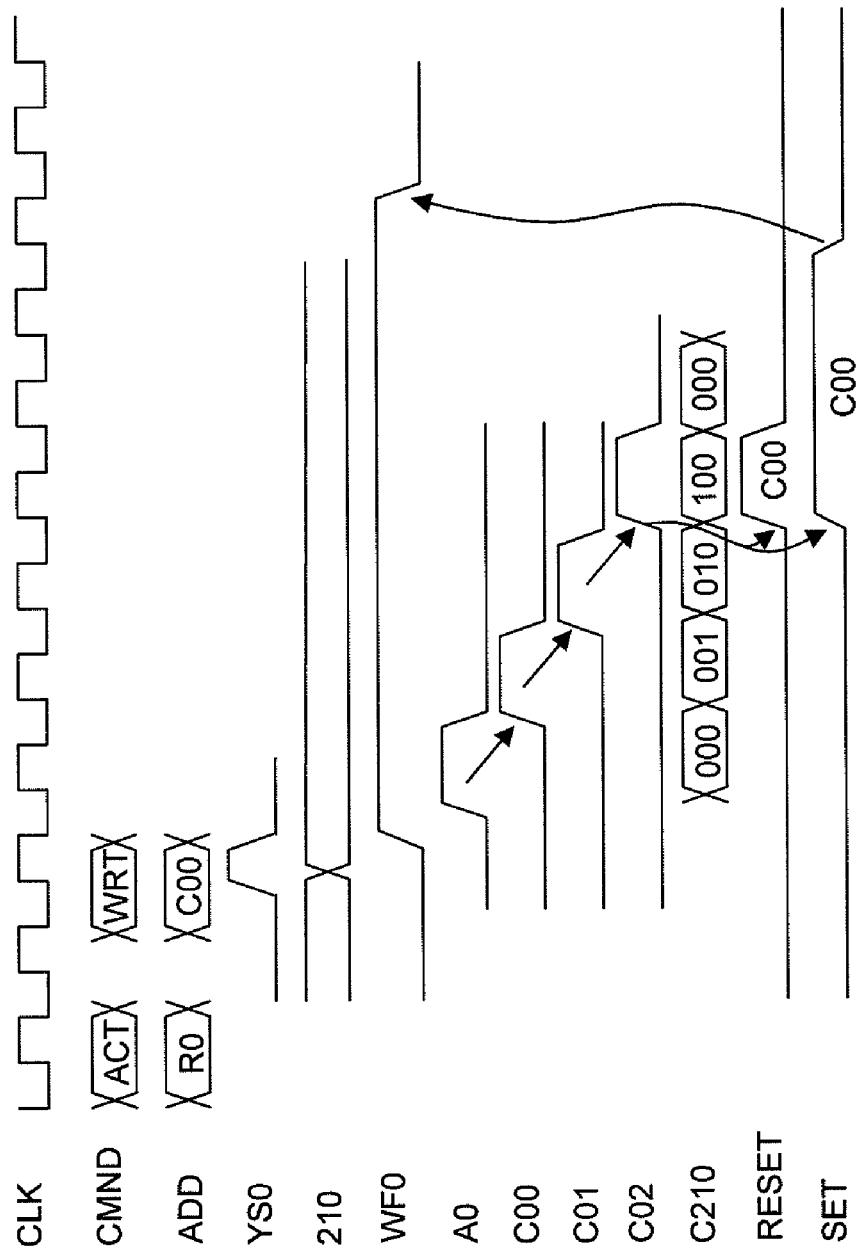
FIG. 14 is a timing chart for explaining an operation when the continuous data writing request to the same group G is not generated within four cycles.

FIG. 14 is a timing chart for explaining an operation when the continuous data writing request to the same group G is not generated within four cycles. FIG. 14 shows a case that a time (=T2) required for the data writing is three cycles and a time (=T1) during which the writing process is withheld is four cycles.

As shown in FIG. 14, when the row address RA, together with the active command ACT, is inputted, and thereafter, the column address CA (=c00), together with the write command WRT, is inputted, the write control circuit 300 causes the corresponding column switch signal (YS0 in FIG. 14) to become active based on the predecode signals YAE and YD0 to YD3. In response thereto, the write flag WF0 becomes active, and thus, in the data latch 210 within the write driver circuit 200, the write data is latched.

On the other hand, within the main control circuit 400, any one of the write cycle signals WCYC0 to WCYC3 (the write cycle signal WCYC0, for example) is active, and thus, the column address CA is fetched into any one of the address comparing circuits 430 to 433 (the address comparing circuit 430, for example). Immediately after the column address CA is fetched, the outputs of the bit comparing circuit 430b all become a high level, and thus, the hit signal HIT0 becomes active. The hit signal HIT0 is shifted to the first to third shift registers 440a to 440c included in the command counter 440. More specifically, at a point at which one cycle is elapsed, an internal node A0 of the first shift register 440a becomes active, and thus, thereafter, the count signals C00, C01, and C02 are successively activated at each lapse of one cycle. This means that the count signal C02 becomes active after four cycles.

However, in this example, the continuous data writing request to the same group G is not generated within four cycles, and thus, at a point at which the count signal C02 becomes active, the count signals C00 and C01 are constantly in an inactive state. That is, the condition under which the count value C210 (=C02, C01, and C00) becomes "100" is satisfied. In response thereto, the pulse generating circuit 450 causes the start pulse WSTRT0, the reset pulse WRST0, and the set pulse WSET0 to become active.

As a result, out of the write driver circuits 200 belonging to the same group G, the write driver circuit 200 corresponding to the column switch signal YS0 and the write flag WF0 becomes active, and the data writing according to the logical value of the write data latched to the data latch 210 is executed.

As shown in FIG. 14, an activation period of the reset pulse RESET is one clock while the set pulse SET is activated over three clocks. When the set pulse SET becomes inactive, the write flag WF0 is returned to a low level, thereby completing a series of writing operations.

Figure 15:
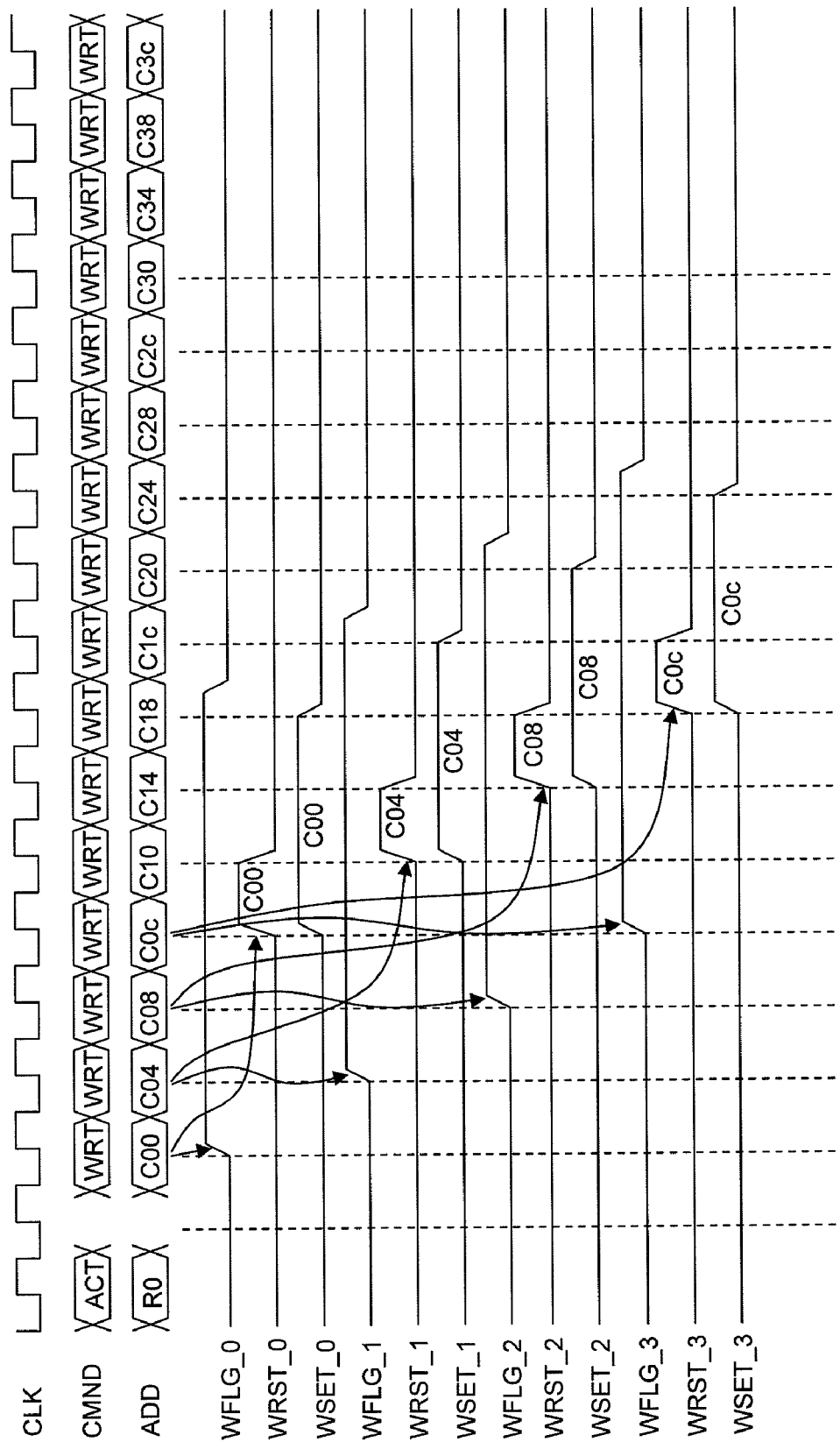
FIG. 15 is another timing chart for explaining an operation when the continuous data writing request to the same group G is not generated within four cycles.

Thus, as shown in FIG. 15, unless the continuous data writing request to the same group G is generated within four cycles, the writing operation is successively performed with a delay of three cycles. In an example shown in FIG. 15, a case that the column address CA is successively inputted in order of c00, c04, c08, and c0c is shown. The column addresses c00, c04, c08, and c0c belong to respectively different groups G.

Figure 16:
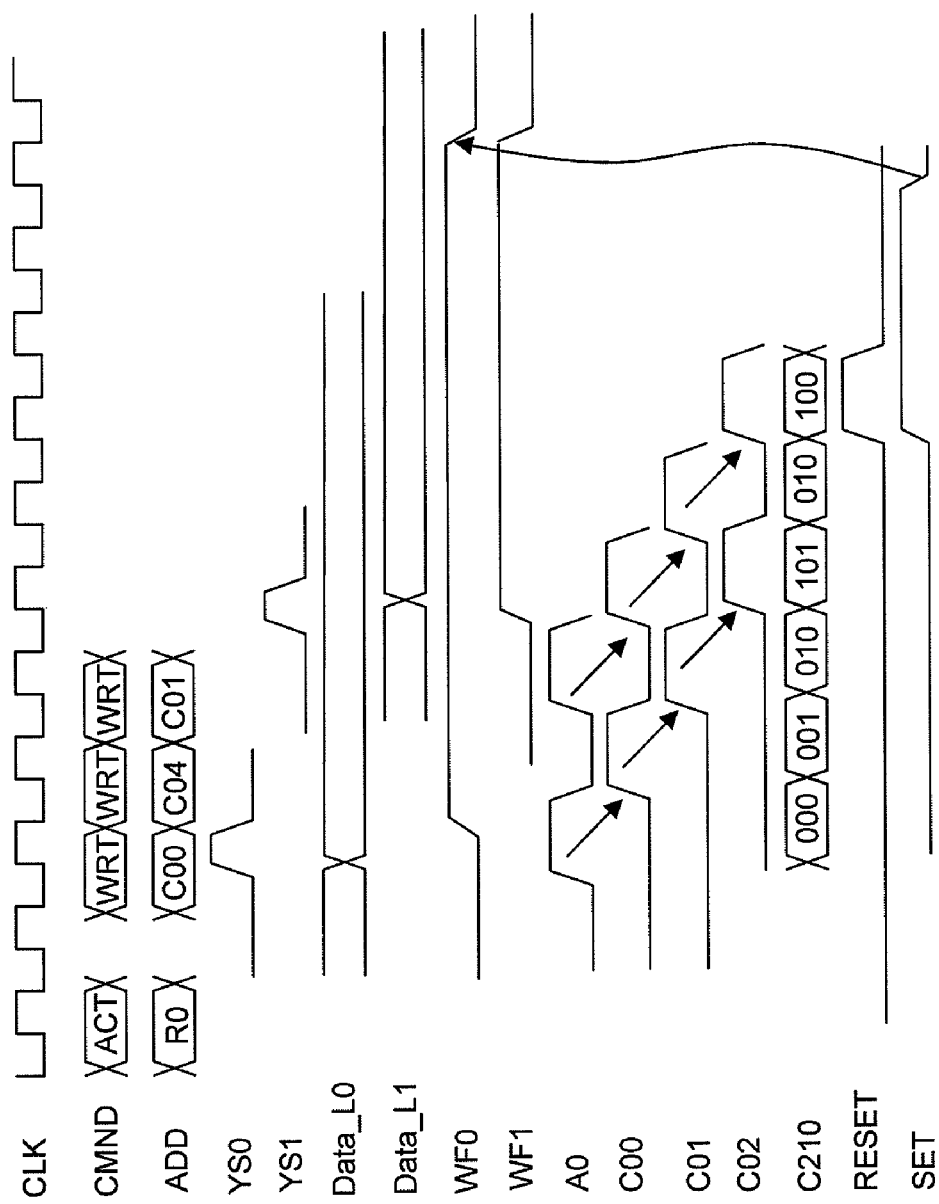
FIG. 16 is a timing chart for explaining an operation when the continuous data writing request to the same group G is generated within four cycles.

FIG. 16 is a timing chart for explaining an operation when the continuous data writing request to the same group G is generated within four cycles.

In an example shown in FIG. 16, after the row address RA, together with the active command ACT, is inputted, the column address CA (=c00), together with the write command WRT, is inputted. Thereafter, the column address CA (=c04) is inputted in a subsequent clock, and the column address CA (=c01) is inputted in a further subsequent clock. Out of these column addresses, the column addresses c00 and c01 belong to the same group G.

Thus, when the column address c00 is fetched into the address comparing circuit 430, the hit signal HIT0 becomes active. Thereafter, the column address c01 is supplied after two clocks, and thus, the hit signal HIT0 becomes active again. As a result, waveforms of the count signals C00, C01, and C02 are formed as those shown in FIG. 16, and thus, unlike the example shown in FIG. 14, even when the count signal C02 becomes active after four cycles, the count value C210 (=C02, C01, and C00) is not "100" but "101". It is after two more cycles (after a total of six cycles) that the condition under which the count value C210 becomes "100" is satisfied. When the count value C210 becomes "100", the pulse generating circuit 450 causes the start pulse WSTRT0, the reset pulse WRST0, and the set pulse WSET0 to become active, as described above.

At this time, both the write flags WF0 and WF1 are activated, and thus, out of the write driver circuits 200 belonging to the same group G, the data writing to the column addresses c00 and c01 are simultaneously executed. Thereafter, when the set pulse SET becomes inactive, the write flags WF0 and WF1 are returned to a low level, thereby completing a series of writing operations.

Thus, when the continuous data writing request to the same group G is generated within four cycles, the main control circuit 400 withholds the data writing process by the write control circuit 300. In response to absence of the data writing request to the same group G within four cycles, the withheld data writing processes are collectively executed.

Figure 17:
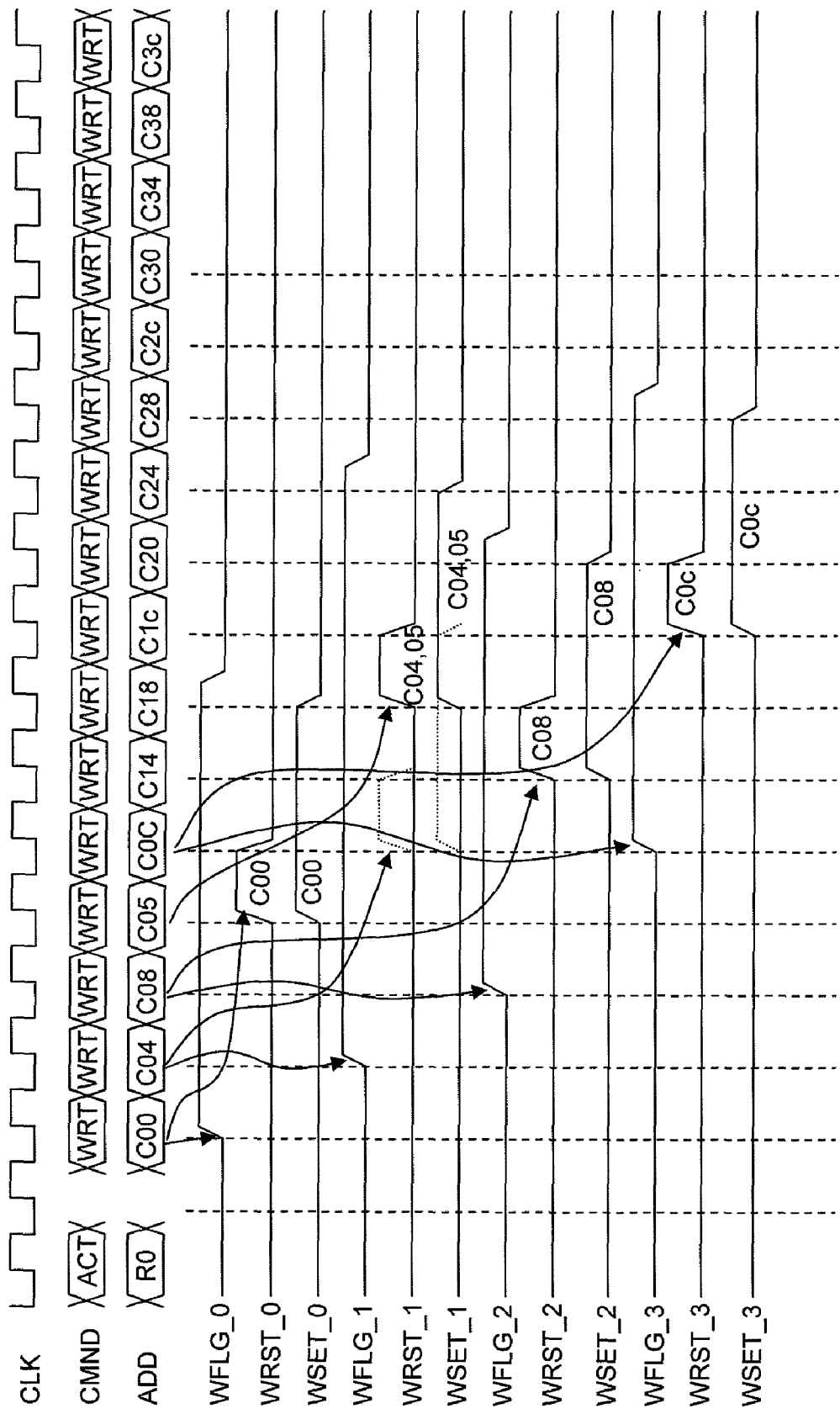
FIG. 17 is another timing chart for explaining an operation when the continuous data writing request to the same group G is generated within four cycles.

Accordingly, as shown in FIG. 17, in the continuous data writing request synchronous with the clock, even when the continuous writing request to the same group G is generated within four cycles, a normal writing operation can be ensured. In an example shown in FIG. 17, a case that the column addresses CA are continuously inputted in order of c00, c04, c08, c05, and c0c is shown. Out of these addresses, the column addresses c04 and c05 belong to the same group G, and the other addresses belong to respectively different groups G.

Figure 18:
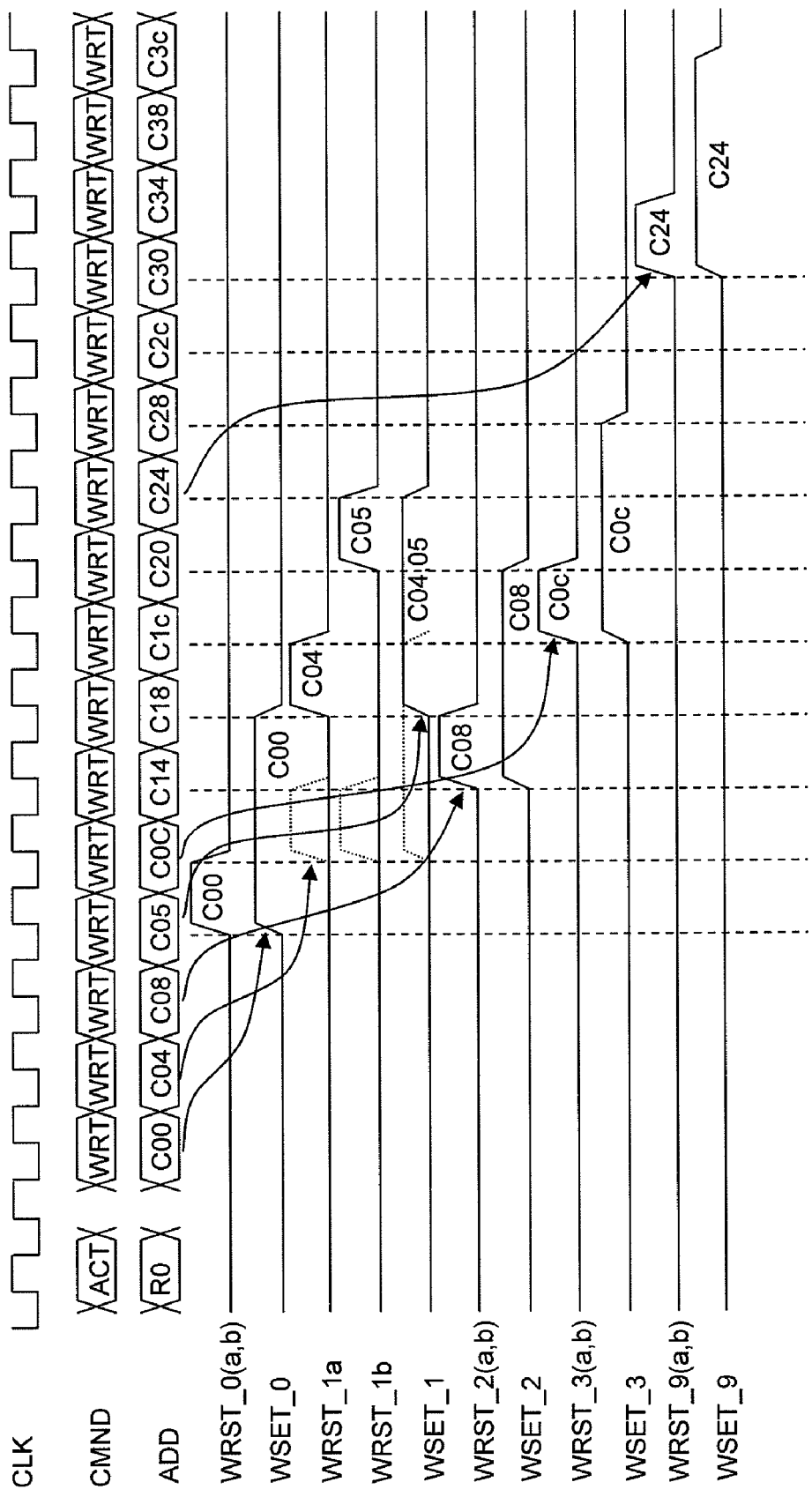
FIG. 18 is still another timing chart for explaining an operation when the continuous data writing request to the same group G is generated within four cycles.

In the example shown in FIG. 17, the set pulse SET and the reset pulse RESET corresponding to the column addresses c04 and c05 are in common. Thereby, both the set operation and the reset operation are simultaneously executed for the column addresses c04 and c05. However, at the time of the reset operation, a larger amount of write currents is applied in a shorter time as compared to a set operation time, and thus, when the reset operations are simultaneously executed for a large number of memory cells, a peak current at the time of the writing increases. To avoid such a problem, the reset pulses RESET can be activated at different timings, as shown in FIG. 18.

As described above, in the semiconductor memory device according to the embodiment of the present invention, although each write control circuit 300 is allocated to a plurality of pages, the writing operation can be enabled similarly to a case that the write control circuit 300 is allocated to each page.

It is apparent that the present invention is not limited to the above embodiments, but may be modified and changed without departing from the scope and spirit of the invention.

For example, in the above embodiment, the semiconductor memory device is the PRAM. However, the present invention is not limited thereto. As long as the semiconductor memory device has a memory cell of which the required time of writing data is relatively long is adopted, the present invention can also be applied to a semiconductor memory device of other types.

What is claimed is:

1. A semiconductor memory device comprising:
a plurality of write control circuits;
a plurality of memory cells grouped into a plurality of groups, each group corresponding to an associated one of the write control circuits;
a plurality of write drivers that store data to a corresponding memory cell when the write control circuits are brought into an active state; and
a main control circuit that brings one of the write control circuits into the active state in response to presence of a data writing request to a memory cell belonging to a predetermined group and subsequent absence of the data writing request to another memory cell belonging to the same group within a predetermined period.

2. The semiconductor memory device as claimed in claim 1, wherein the main control circuit withholds a data writing process corresponding to a first data writing request to a predetermined group in response to subsequent presence of a second data writing request to the same group within the predetermined period.

3. The semiconductor memory device as claimed in claim 2, wherein the main control circuit brings said one of the write control circuits into the active state so as to perform the data writing process corresponding to the first data writing request in response to an absence of the data writing request to the same group after the second data writing request within the predetermined period.

4. The semiconductor memory device as claimed in claim 3, wherein the main control circuit simultaneously performs the data writing processes corresponding to the first and second data writing requests.

5. The semiconductor memory device as claimed in claim 3, wherein the main control circuit performs the data writing processes corresponding to the first and second data writing requests at a different timing.

6. The semiconductor memory device as claimed in claim 1, wherein each group includes the plurality of memory cells belonging to a plurality of pages.

7. The semiconductor memory device as claimed in claim 1, wherein the predetermined period is equal to or longer than a required time of writing for the memory cells.

8. The semiconductor memory device as claimed in claim 1, wherein each memory cell includes a phase change material.

9. The semiconductor memory device as claimed in claim 8, wherein the write drivers supply a write current to the memory cells, and each write control circuit supplies corresponding write driver circuits with a write pulse for determining an amount and an applying time of the write current.

10. The semiconductor memory device as claimed in claim 9, wherein the write pulse includes a set pulse for crystallizing the phase change material and a reset pulse for amorphizing the phase change material.

11. A control method of a semiconductor memory device including a plurality of write control circuits, a plurality of memory cells grouped into a plurality of groups each corresponding to an associated one of the write control circuits, and a plurality of write drivers that store data to a corresponding memory cell when the write control circuits are brought into an active state, the control method comprising:

withholding a data writing process corresponding to a first data writing request in response to presence of the first data writing request to a predetermined group and subsequent presence of a second data writing request to the same group within a predetermined period; and performing the data writing process corresponding to the first data writing request in response to subsequent absence of the data writing request to the same group after the second data writing request within the predetermined period.

* * * * *